(12) United States Patent
Fowler

(10) Patent No.: US 8,102,456 B2
(45) Date of Patent: Jan. 24, 2012

(54) CCD ARRAY WITH INTEGRATED HIGH VOLTAGE PROTECTION CIRCUIT

(75) Inventor: Boyd Fowler, Sunnyvalle, CA (US)

(73) Assignee: BAE Systems Imaging Solutions, Inc., Milpitas, CA (US)

( * ) Notice: Subject to any disclaimer, the term of this patent is extended or adjusted under 35 U.S.C. 154(b) by 90 days.

(21) Appl. No.: 12/818,573

(22) Filed: Jun. 18, 2010

(65) Prior Publication Data

US 2010/0255642 A1 Oct. 7, 2010

Related U.S. Application Data

(62) Division of application No. 11/686,668, filed on Mar. 15, 2007, now Pat. No. 7,764,316.

(51) Int. Cl.
H04N 3/14 (2006.01)
H04N 5/335 (2011.01)
H01L 21/00 (2006.01)
H01L 21/82 (2006.01)
H01L 23/62 (2006.01)

(52) U.S. Cl. .......... 348/314; 438/64; 438/129; 348/311; 257/355

(58) Field of Classification Search .......... 348/298–299, 348/311, 314; 438/64, 129, 311; 257/355–357, 257/360; 361/56, 111
See application file for complete search history.

(56) References Cited

U.S. PATENT DOCUMENTS

| 5,373,179 | A | * | 12/1994 | Matsui et al. | 257/355 |
| 5,597,758 | A | * | 1/1997 | Heim et al. | 438/527 |
| 5,684,323 | A | * | 11/1997 | Tohyama | 257/363 |
| 6,285,536 | B1 | * | 9/2001 | Holberg et al. | 361/56 |
| 6,631,059 | B1 | * | 10/2003 | Kwon | 361/56 |
| 6,949,802 | B2 | * | 9/2005 | Shih et al. | 257/401 |
| 6,954,098 | B2 | * | 10/2005 | Hsu et al. | 327/313 |
| 6,963,111 | B2 | * | 11/2005 | Reddy et al. | 257/356 |
| 6,987,300 | B2 | * | 1/2006 | Yach et al. | 257/361 |
| 6,987,301 | B1 | * | 1/2006 | Zhang et al. | 257/362 |
| 6,987,871 | B2 | * | 1/2006 | Kalnitsky et al. | 382/124 |
| 2002/0043688 | A1 | * | 4/2002 | Van Lieverloo | 257/367 |
| 2004/0183135 | A1 | * | 9/2004 | Kwon et al. | 257/355 |
| 2005/0253044 | A1 | * | 11/2005 | Kuriyama | 250/208.1 |

* cited by examiner

Primary Examiner — Kelly L Jerabek
(74) Attorney, Agent, or Firm — Calvin B. Ward

(57) ABSTRACT

A CCD containing circuit and method for making the same. The circuit includes a CCD array and a protection circuit. The CCD array is constructed on an integrated circuit substrate and includes a plurality of gate electrodes that are insulated from the substrate by an insulating layer. The gate electrodes are connected to a conductor bonded to the substrate. The protection circuit is also constructed on the substrate. The protection circuit is connected to the conductor and to the substrate and protects the CCD array from both negative and positive voltage swings generated by electrostatic discharge events and the like. The protection circuit and the CCD can be constructed in the same integrated circuit fabrication process.

3 Claims, 5 Drawing Sheets

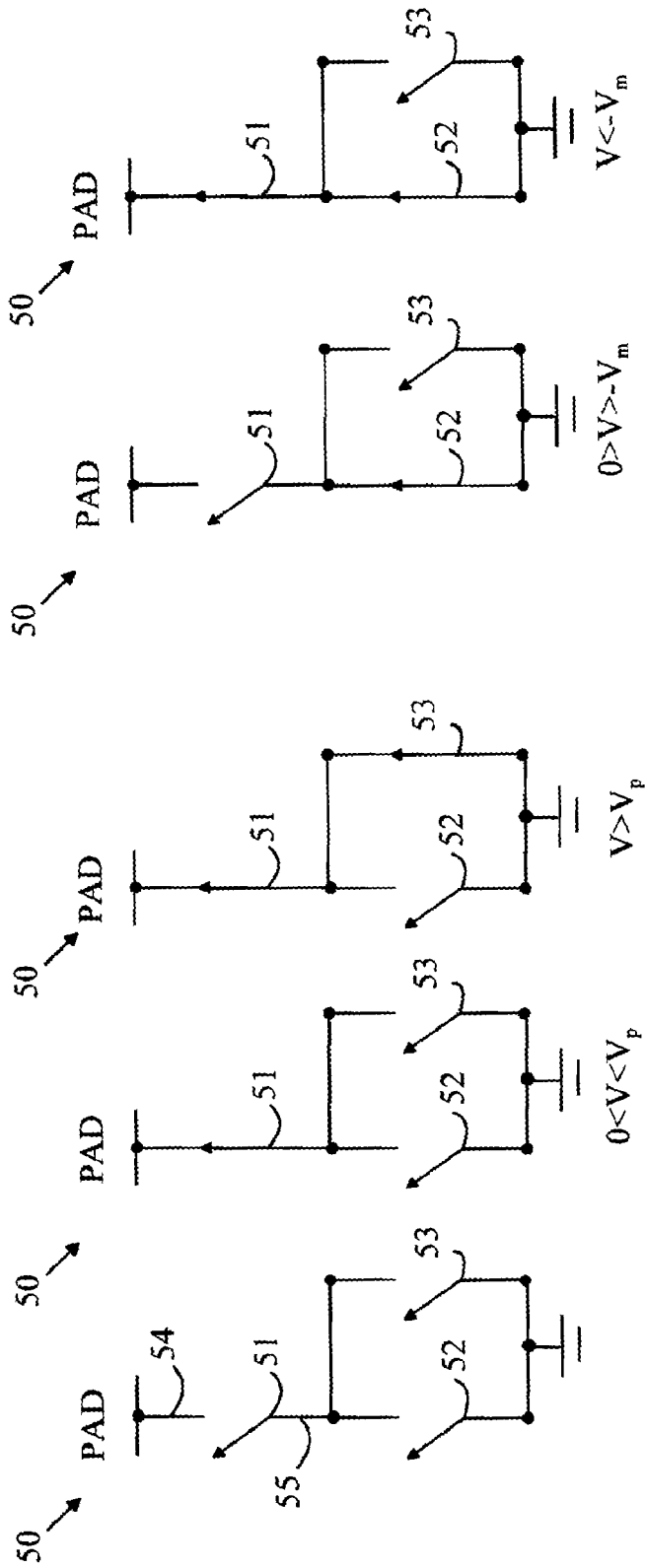

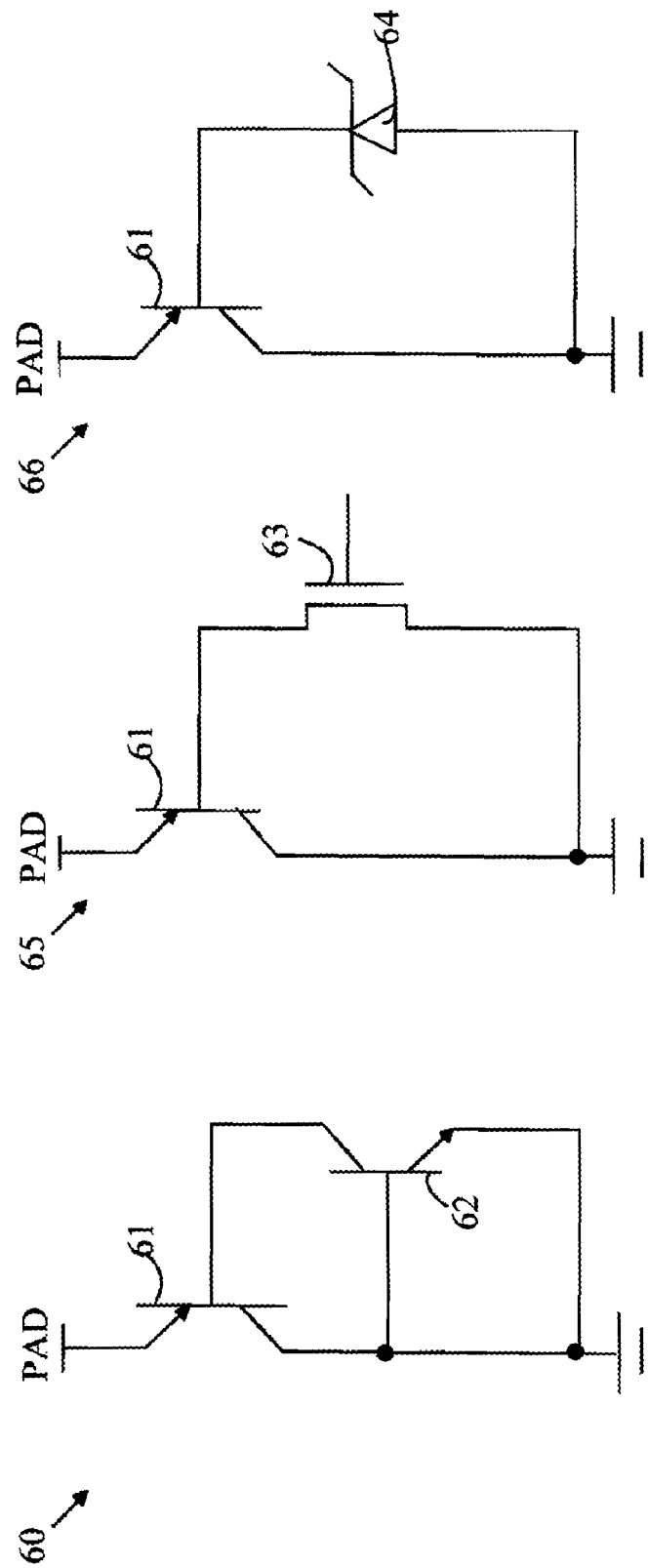

CCD ARRAY WITH INTEGRATED HIGH VOLTAGE PROTECTION CIRCUIT

CROSS REFERENCE TO RELATED APPLICATIONS

This is a divisional of application Ser. No. 11/686,668 filed on Mar. 15, 2007 now U.S. Pat. No. 7,764,316.

BACKGROUND OF THE INVENTION

Integrated circuits are subject to damage from electrostatic discharge (ESD) events. A person can cause such an event by touching an input lead to a device or a conductor connected to that lead. Such discharges are characterized by voltages in the kilovolt range and instantaneous currents in the ampere range. As circuit geometries are reduced to provide faster and more complex integrated circuits, the vulnerability of the integrated circuits to such events increases.

To protect such circuits, a protection circuit is often attached to the input pads on the chip. The circuit shorts the pad to the substrate on the chip if the voltage on the pad exceeds a predetermined value. Numerous protection circuits for use in CMOS circuitry are known to the art. The simplest form of ESD protection circuit consists of one or more diodes connected in series to form a chain that is connected between the pad and the substrate. As long as the voltage on the pad is less than the diode threshold, little current flows from the pad to ground through the diode chain. If the voltage is greater than the diode threshold of the chain, the circuit will conduct charge from the pad to ground, and hence, prevent the voltage on the pad from increasing much beyond the diode threshold. The voltage at which the chain conducts is determined by the number of diodes in the chain.

Unfortunately, these circuits cannot be used in charge-coupled devices (CCDs). Imaging chips that are utilized in a wide range of camera devices are based on CCD arrays. The CCD structure can be viewed as a number of columns that are divided into pixels whose boundaries can be moved to read out the charge by shifting the charge down the columns. The boundaries of the pixels and the charge shifting mechanism are implemented with a plurality of gates that overlie the portion of the substrate in which the columns are located. Each pixel on the chip has a plurality of gates. The gates are separated from the substrate by a thin oxide layer. If the potential difference between the gates and the substrate is sufficiently high, the oxide layer can be damaged. For example, a short can be formed from the gate to the substrate. As will be discussed in more detail below, each gate belongs to a specific class, and all of the gates in a class are connected together. Hence, such a short effectively shorts all of the gates in that class and renders the chip, or a large portion thereof, inoperative. Even if the resultant oxide damage does not short the gate to the substrate, the oxide damage can result in long-term reliability problems that lead to premature device failure. Unlike CMOS circuitry, CCD designs do not lend themselves to the inclusion of spare rows and/or columns that can be connected after fabrication to correct problems such as the gate to substrate shorts discussed above.

The gates in a CCD must be switched to both positive and negative potentials with respect to the substrate. Hence, a pad on the CCD used to drive the gates must be able to swing between −V1 and +V2 without a significant current flowing between the pad and substrate. However, if the voltage is significantly less than −V1 or greater than V2, the ESD protection circuit must be actuated to short the excess current to the substrate.

If a diode structure such as that described above is utilized to protect the circuit from voltage excursions above V2, the protection circuit will begin to conduct when the voltage on the pad goes above V2 or swings to a potential below 0. Hence, the protection circuit would short circuit the pad during the operation of the device when the pad is required to swing to −V1. In principle, this problem could be solved by utilizing a protection circuit consisting of two zener diodes of opposite polarity connected in series. However, construction of such pairs of diodes in the fabrication process used to construct CCD arrays is not practical.

It should also be noted that the CCD array can be damaged by charge buildup at a number of points in its fabrication or incorporation into a larger device in addition to the ESD events discussed above. Typically, the CCD chip is fabricated and then bonded to another substrate that includes the drive circuitry for the various electrodes. Damage from events that occur after the bonding to the drive substrate can be reduced by incorporating protection devices on the drive substrate. Such circuitry is not subject to the same fabrication limitations that limit the fabrication of the protection circuit on the CCD chip itself, and hence, conventional protection circuits can be utilized. However, protection circuitry on the drive substrate does not prevent damage that occurs prior to the bonding process. The CCD is subject to ESD during the handling of the wafers prior to bonding and during the bonding processes. In addition, some of the etching processes utilized after the electrodes have been fabricated over the oxide layer can lead to a charge buildup on the electrodes. This charge buildup can also damage the oxide layer.

SUMMARY OF THE INVENTION

The present invention includes a CCD circuit and method for making the same. The circuit includes a CCD array and a protection circuit. The CCD array is constructed on an integrated circuit substrate and includes a plurality of gate electrodes that are insulated from the substrate by an insulating layer. The gate electrodes are connected to a conductor bonded to the substrate. The protection circuit is also constructed on the substrate. The protection circuit is connected to the conductor and to the substrate. The protection circuit has a first state in which the protection circuit provides an impedance greater than an operating impedance between the conductor and the substrate and a second state in which the protection circuit provides a shorting impedance between the conductor and the substrate. The protection circuit is in the first state if the potential on the conductor is in an operating range defined by a negative threshold potential and a positive threshold potential, and the protection circuit is in the second state if the potential on the conductor is outside the operating range. The protection circuit and the CCD can be constructed in the same integrated circuit fabrication process.

BRIEF DESCRIPTION OF THE DRAWINGS

FIGS. 3A-3E illustrate one type of protection circuit according to the present invention.

FIGS. 4A-4C are schematic drawings of three embodiments of a protection circuit according to the present invention for use with an NMOS CCD array.

DETAILED DESCRIPTION OF THE PREFERRED EMBODIMENTS OF THE INVENTION

The present invention utilizes protection circuits that are fabricated on the CCD chip using the limited fabrication processes that are available in the CCD fabrication process. The protection circuits are operative to protect the oxide layer from charge buildup or ESD events that occur after the drive lines are connected to the protection devices, and hence, the CCD device is protected from some of the charge buildup that occurs in the etching processes in the later stages of the device fabrication as well as ESD events that occur after the protection circuit is connected to the gates.

Figure 1:
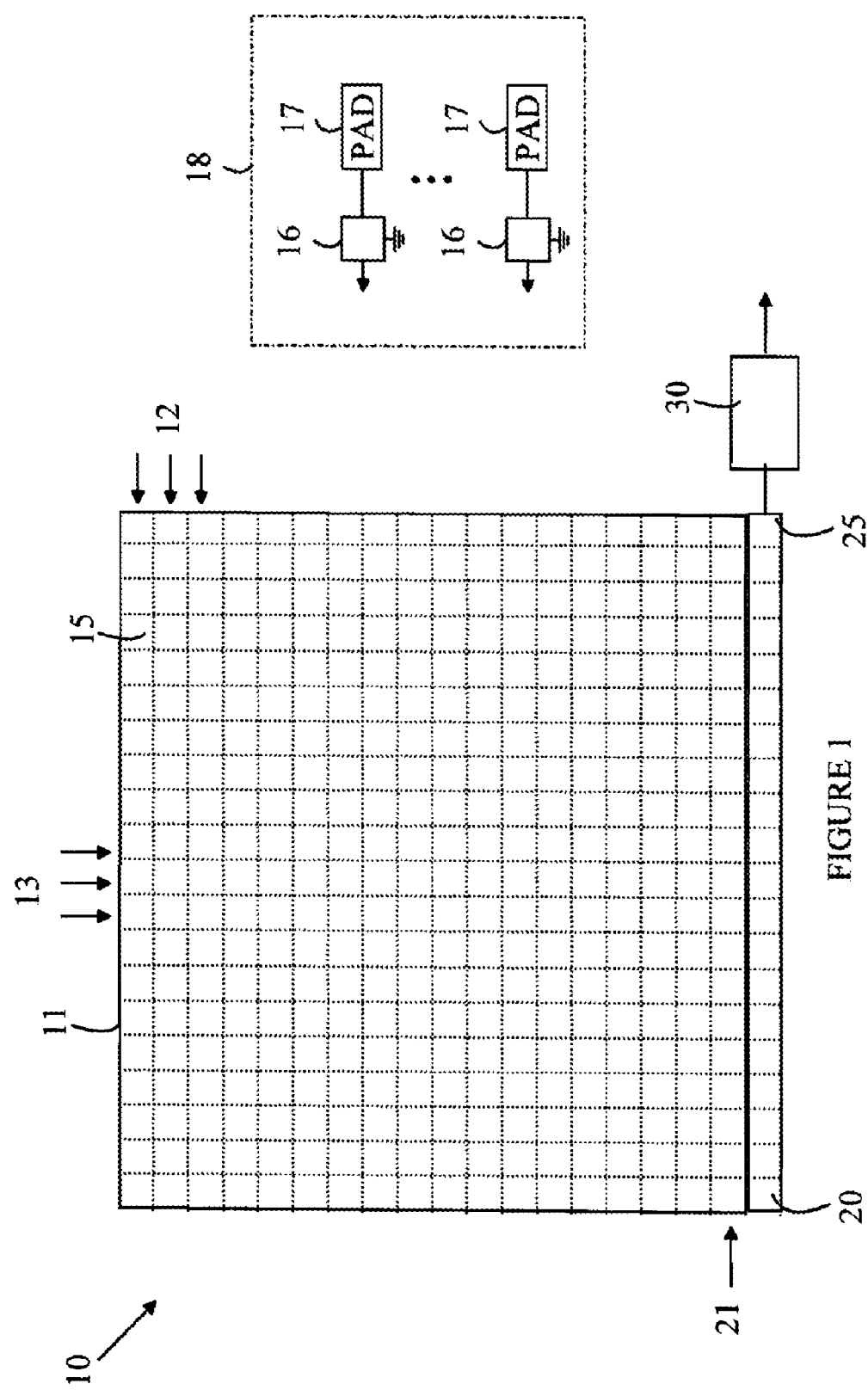
FIG. 1 illustrates a CCD imaging sensor chip according to one embodiment of the present invention.

The manner in which the present invention provides its advantages can be more easily understood with reference to FIG. 1, which illustrates a CCD imaging sensor chip according to one embodiment of the present invention. Image sensor 10 includes a photodetector array 11 in which the individual photodetectors 15 are organized as a plurality of rows 12 and columns 13. The boundaries of each photodetector are defined by a number of gates that are fabricated over the column in which the photodetector is located. In addition, the columns can be operated as shift registers to move charge stored in the various photodetectors after the array is exposed to an image, to shift register 20 by manipulating the potentials on the gates in that column. On each column shift operation, the contents of the photodetectors in row 21 are shifted into register 20, and the contents of each column are moved downward toward shift register 20. The contents of shift register 20 are then shifted horizontally into an output amplifier 30 that converts the charge in cell 25 to an output voltage in an analogous manner.

Each pixel has a plurality of gates that are used to define the pixel area within the column in which the pixel resides. The boundaries of the columns along the long sides of the columns are defined by implants. These gates consist of electrodes that are also used to shift the charge in a pixel along the columns during a readout operation. The number of electrodes varies according to the specific chip design. However, the corresponding electrodes in each pixel are connected together and are driven by off-chip circuits that are connected to drive lines via an interface 18 comprising a plurality of signal pads 17. Each signal pad is connected to the chip substrate by a protection circuit 16. To simplify the drawing, the various electrodes used in the shifting operations have been omitted from FIG. 1.

Figure 2:
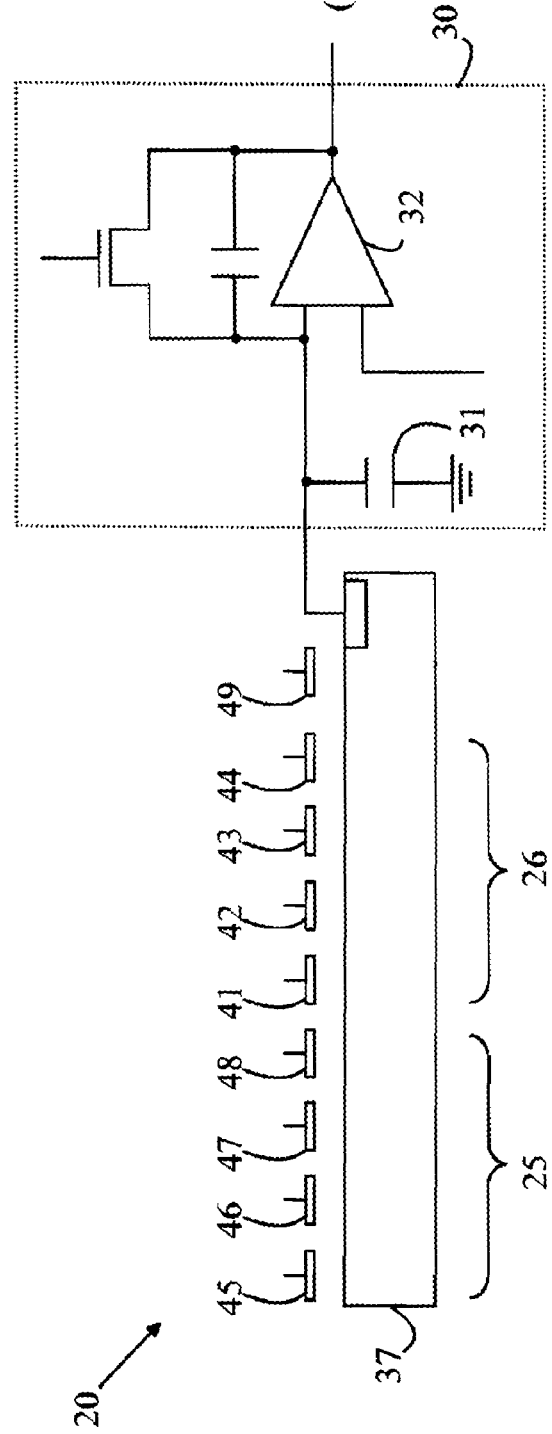
FIG. 2 illustrates the output end of shift register 20 and output amplifier 30 in a four-phase CCD.

Refer now to FIG. 2, which illustrates the output end of shift register 20 and output amplifier 30 in a typical four-phase CCD. The shifting operation along the columns that deposits charge into shift register 20 operates in a manner analogous to that described below for shift register 20. The manner in which charge is shifted along shift register 20 is known to the art, and hence, will not be discussed in detail here. For the purposes of this discussion, it is sufficient to note that each cell in shift register 20 includes an area of silicon in which the charge moves, and 4 electrodes that set the profile of potentials in that silicon area. Two such cells are shown at 25 and 26. The electrodes over the silicon area 37 of cell 26 are shown at 41-44. At the start of a shift cycle, the electrodes 41 and 44 are at potentials that contain the charge in the region under electrodes 42 and 43. To move the charge into amplifier 30, the potential at electrode 42 is altered to force the charge into the region under electrode 44. The potential on electrodes 44 and 49 is then altered to allow the charge to escape onto capacitor 31 at the input to amplifier 32. The potential on electrodes 43 and 44 is then sequentially altered to force the charge under these electrodes to move onto capacitor 31. It should be noted that the potential on electrode 49, which acts as an output gate, is maintained at a constant potential. This output gate reduces clock coupling between the other electrodes and capacitor 31.

During the shift operation, the potentials on electrodes 45-48 associated with cell 25 are likewise manipulated to force the charge in cell 25 into cell 26. For example, when the potential on electrode 42 is altered to force charge under that electrode to the area under electrode 43, electrode 41 is no longer needed to contain the charge within cell 26. Hence, the potential on this electrode can be altered to allow charge from cell 25 to move under electrode 41. Similarly, when the potential on electrode 43 is altered to move the charge under electrode 44, the potential on electrode 42 is no longer needed to separate the charge in cells 25 and 26, and hence this electrode's potential can be altered to allow the charge from cell 25 to move under that electrode. The potential on the electrodes in cell 25 can then be altered to force the remaining charge from cell 25 to move under electrode 43 thereby completing the shifting of the charge from cell 25 to cell 26 while the charge from cell 26 was shifted onto capacitor 31.

As noted above, during the shifting operations, the potential on the various electrodes varies between a −V1 and +V2. In a multiphase pinned operation the typical high voltage on the vertical CCD gates is 5 volts and the typical low voltage is −8 volts. Hence, the protection circuits shown in FIG. 1 must not present a source of significant leakage current for either polarity within this range. However, the protection circuits shown at 16 in FIG. 1 must operate to short a signal less than −V3 or greater than V4 to ground, where −V3<−V1 and V4>V2.

In addition, the protection circuits must be of a type that can be fabricated in the same fabrication system as that used to construct the various shift registers, electrodes, and other circuitry on chip 10. CCDs require high charge-transfer efficiency. To achieve this efficiency, CCDs are fabricated using specialized processes that minimize imperfections in the semiconductor material. Most logic circuitry relies on CMOS fabrication techniques. In general, the fabrication processes used to produce CCD and CMOS imagers are incompatible. For example, conventional CMOS fabrication processes require complex shallow implants and isolation that lead to unacceptable imperfections in the underlying semiconductor materials. While generally acceptable in CMOS devices, these imperfections typically reduce the efficiency of CCD devices to unacceptable levels.

CCD devices are typically manufactured in an NMOS or PMOS process. If the CCD is an NMOS device, NMOS FET transistors, N type JFETs, PNP bipolar transistors, and NPN bipolar transistors with their bases shorted to ground can be fabricated; however, NPN transistors with floating bases, P type JFETs, and PMOS FETs cannot be fabricated. Hence, the protection circuits must be constructed from PNP transistors, NPN transistors with their bases shorted to ground, N type JFETs, and NMOS transistors, or diodes of one polarity.

Similarly, if the CCD is a PMOS device, PMOS FET transistors, P type JFETs, and PNP transistors with their bases shorted to ground, and NPN bipolar transistors can be fabricated; however PNP bipolar transistors with floating bases, N type JFETs, and NMOS FETs cannot be fabricated. In this case, the protection circuits must be constructed from NPN transistors, PNP bipolar transistors with their bases shorted to ground, and PMOS transistors, or diodes of the opposite polarity.

To simplify the following discussion it will be assumed that the CCD is fabricated in NMOS. Refer now to FIGS. 3A-3E, which illustrate one type of protection circuit according to the present invention. To simplify the discussion, the protection circuit will be described in terms of switches. The first type of switch will close if the voltage difference across the switch is greater than a predetermined voltage Vp, which is greater than 0. Switch 53 is of this type. The second class of switches will close if either of two conditions is satisfied. Referring to switch 51, switch 51 closes if the potential on terminal 54 is greater than the potential on terminal 55. In addition, switch 51 will close if the potential on terminal 54 is less than the potential on terminal 55 by an amount that is greater than Vm, which is greater than 0. Switch 52 is also of this type.

Protection circuit 50 utilizes 3 switches, 51-53. Switch 51 is connected to the pad that is to be protected by terminal 54. Switches 52 and 53 are connected in parallel between ground and terminal 55. It will be assumed that the substrate is held at ground. Denote the voltage on the pad relative to ground by V.

Consider the case in which the potential on the pad is positive. Referring to FIG. 3B, if V is between 0 and Vp, switch 51 will be closed; however both switches 52 and 53 will be open, and hence, no current flows from the pad to ground through the protection circuit. If, however, the potential increases above Vp, switch 53 will close as shown in FIG. 3C. Hence, the pad is protected from positive voltage spikes that are greater than Vp.

Next, consider the case in which the potential on the pad is negative. Referring to FIG. 3D, if the potential is between ground and −Vm, switches 51 and 53 will remain open; while switch 52 will close. Hence, no current flows from the pad to ground through the protection circuit. If, however, the pad potential becomes more negative than −Vm, switch 51 will close, and the pad will be shorted to ground. Hence, the pad is also protected from negative voltage spikes having a magnitude greater than Vm.

As noted above, the switches in question must be fabricated in the same fabrication system as the CCD array. Refer now to FIGS. 4A-4C, which are schematic drawings of three embodiments of a protection circuit according to the present invention for use with NMOS CCD arrays. In all of these circuits, switches 51 and 52 are implemented with a PNP bipolar transistor. Switch 51 is the base-emitter junction of transistor 61, and switch 52 is the collector-base junction of transistor 61. In this case, Vm is the punch through voltage between the collector and the emitter of transistor 61.

Referring to FIG. 4A, switch 53 is also implemented with an NPN bipolar transistor with its base shorted to ground in protection circuit 60. Vp is the collector emitter punch through voltage. When the pad is between 0 and Vp, the base-emitter junction of transistor 61 is forward biased, and hence, the potential on the pad is transferred to the collector of transistor 62 which is non-conducting since it's base is held at ground. When the pad potential exceeds Vp, transistor 62 punches through and forms a low impedance path to ground thereby shorting the pad to ground. When the pad potential is between 0 and −Vm, the base-emitter junction of transistor 61 is reverse-biased and hence will not conduct. However, when the potential decreases to below −Vm, the collector to emitter junction will punch through; the base collector junction will be forward biased, and hence, the pad will be connected to ground through transistor 61. The values of Vm and Vp in protection circuit 60 are controlled by the fabrication parameters of transistors 61 and 62, respectively.

Referring now to FIG. 4B, protection circuit 65 operates in a manner analogous to that described above. Switch 53 is implemented as a field effect transistor 63. The punch through voltage for transistor 63 can be tuned by applying a potential to the gate of the transistor. Hence, protection circuit 65 provides a variable Vp.

Referring now to FIG. 4C, protection circuit 66 also operates in a manner analogous to that described above. In this embodiment, switch 53 is implemented as a zener diode 64 whose zener voltage is equal to Vp.

Figures 5A, 5B, 5C:
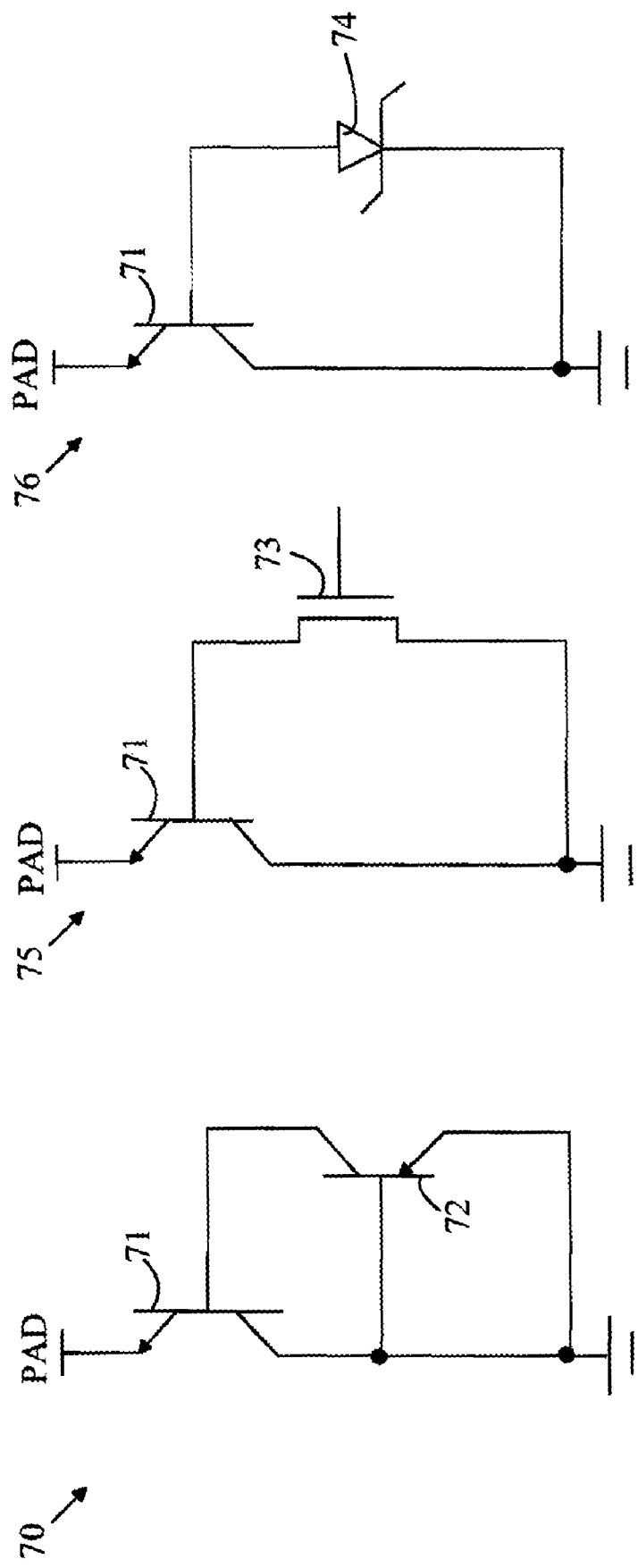
FIGS. 5A-5C are schematic drawings of three protection circuits according to the present invention that could be used with a PMOS CCD array.

The above-described embodiments were implemented in an NMOS CCD fabrication system. Analogous circuits can be provided for use with a PMOS CCD array. In that case, switches 51 and 53 would be implemented as an NPN transistor and a PNP transistor with its base shorted to ground. Refer now to FIGS. 5A-5C, which are schematic drawings of three protection circuits that could be used with a PMOS CCD. Protection circuits 70, 75, and 76 are analogous to protection circuits 60, 65, and 66, respectively. The switches 51 and 52 shown in FIG. 3A are implemented with a PNP bipolar transistor with its base shorted to ground 71. Switch 53 is implemented with an NPN bipolar transistor 72, a FET 73, and a zener diode 74, respectively in protection circuits 70, 75, and 76.

Referring to FIG. 5A, when the pad is negatively biased with a potential having a magnitude less than a first threshold, the emitter-base junction of transistor 71 is forward biased, and hence, the potential is transferred to the collector of transistor 72. However, both transistor 72 and the collector-base junction of transistor 71 are non-conducting, and hence, no current flows from the pad to ground. Once the potential on the pad becomes more negative than the first threshold value, transistor 72 punches through, and current flows from the pad to ground. Similarly, when the pad is at a positive potential below a second threshold value, the emitter-base junction of transistor 71 is reverse-biased, and hence, non-conducting. In this case, no current flows from the pad to ground. However, when the potential on the pad exceeds this threshold, transistor 71 punches through, and current flows from the pad to ground. Protection circuits 75 and 76 operate in a similar manner, and hence, will not be discussed in detail here.

In one embodiment of the present invention, the protection circuit is fabricated in the same process as the CCD. The CCD electrodes are typically constructed of polysilicon. As noted above, each pixel has a plurality of electrodes. The corresponding electrodes in each pixel are connected to a common drive line that connects the electrodes in each column to a common drive line. The drive lines run at right angles to the columns. If there are 4 electrodes per pixel, and N pixels per column, there will be 4N such drive lines. The 4N drive lines are connected to 4 electrodes at the edge of the sensor. The drive lines are typically etched from the first metal layer in the fabrication process. The protection circuit is completed by the time the polysilicon electrodes are completed. Hence, when the first metal layer is deposited, the CCD electrodes are electrically connected to the protection circuits. Initially, all of the electrodes are connected to all of the protection circuits, since the individual drive lines have not yet been etched from the metal layer.

The CCD electrodes are floating gates, and hence, any charge that is deposited on the electrodes during subsequent processing can result in a potential between the electrodes and the substrate that is sufficient to damage the gate oxide that separates the electrodes from the substrate. During the etching of the various metal layers to form individual conductors, electrostatic charges can build up on the electrodes. In this embodiment of the present invention, a large voltage that builds up on the electrodes is discharged to ground by the protection circuit through the metal layer. Hence, the CCD is protected from such charge build up once the first metal layer is deposited.

In addition, the CCD chip is protected from ESD events that occur after the first metal layer is deposited. Some CCD imaging arrays are constructed from a CCD array and a second substrate that includes the circuitry that drives the various electrodes and processes the charge that is shifted off of the CCD array. These two substrates are fabricated separately and then bonded together by solder bump bonding or other techniques. During the handling of the CCD array chip prior to the completion of the bonding of the CCD chip to the second substrate, the CCD chip is vulnerable to damage from ESD events. The present invention provides protection from the ESD events that occur after the first metal layer has been deposited.

It should be noted that, in principle, a protection circuit of a conventional design could be incorporated in the second substrate. However, in contrast to the present invention, such a protection circuit cannot protect the CCD array from the types of damage discussed above that can occur prior to the bonding of the CCD chip to the second substrate. Hence, the present invention provides a substantial improvement over prior art techniques for protecting CCD arrays.

In the above-described embodiments of the present invention, the switches have been described in terms of devices that are either open, and hence, provide infinite impedance, or closed, and hence, provide a perfect short between their terminals. However, it will be appreciated by those skilled in the art that the protection circuit can have finite impedances and still function satisfactorily. A protection circuit according to the present invention has two states. In the first state, the protection circuit provides an operating impedance between the conductor and the substrate. The operating impedance is defined to be an impedance greater than the impedance at which the leakage current through the protection circuit would interfere with the operation of the normal CCD array.

In the second state, the protection circuit provides a shorting impedance between the conductor and the substrate. The shorting impedance is defined to be any impedance that is less than the impedance at which the CCD array would be damaged if the conductor were raised to a potential outside the operating range of the CCD by a predetermined ESD event or a predetermined level of charge buildup during the fabrication process. It will be appreciated that these design parameters will depend on the individual CCD design and the anticipated environment in which the CCD is fabricated and designed to operate. A typical ESD event is modeled using the "human body model", a 100 pF capacitance with 2000 volts across it in series with a 1 K ohm load, must be shorted to any pin on the CCD without causing damage. Damage to CCD gates is a function of gate oxide thickness, but it typically occurs above +/−30 volts in reference to the substrate.

Various modifications to the present invention will become apparent to those skilled in the art from the foregoing description and accompanying drawings. Accordingly, the present invention is to be limited solely by the scope of the following claims.

What is claimed is:

1. A method for fabricating a CCD device on a substrate comprising:

fabricating a CCD array and a protection circuit on said substrate using the same fabrication process, said CCD array comprising a plurality of gate electrodes that are connected to said protection device by a conductor, said protection circuit being connected to said conductor and to said substrate, said protection circuit having a first state in which said protection circuit provides an impedance greater than an operating impedance between said conductor and said substrate and a second state in which said protection circuit provides a shorting impedance between said conductor and said substrate, said protection circuit being in said first state if the potential on said conductor is in an operating range defined by a negative threshold potential and a positive threshold potential, and said protection circuit being in said second state if said potential on said conductor is outside said operating range; and connecting said gate electrodes to said protection circuit by a metal layer.

2. The method of claim 1 wherein said process comprises a PMOS process and wherein said protection circuit comprises an NPN bipolar transistor and a PNP bipolar transistor with its base shorted to ground.

3. The method of claim 1 wherein said process comprises an NMOS process and wherein said protection circuit comprises a PNP bipolar transistor and an NPN bipolar transistor with its base shorted to ground.

* * * * *